(12) United States Patent
Liu et al.

(10) Patent No.: US 12,276,024 B2
(45) Date of Patent: Apr. 15, 2025

(54) DEVICE AND METHODS FOR CHEMICAL VAPOR DEPOSITION

(71) Applicant: Taiwan Semiconductor Manufacturing Company, Hsinchu (TW)

(72) Inventors: Yung-Tsun Liu, Taipei (TW); Kuang-Wei Cheng, Hsinchu (TW); Sung-Ju Huang, Taipei (TW); Chih-Tsung Lee, Hsinchu (TW); Chyi-Tsong Ni, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 385 days.

(21) Appl. No.: 17/671,965

(22) Filed: Feb. 15, 2022

(65) Prior Publication Data

US 2023/0257882 A1    Aug. 17, 2023

(51) Int. Cl.
*C23C 16/455* (2006.01)
*C23C 16/40* (2006.01)

(52) U.S. Cl.
CPC ...... *C23C 16/45565* (2013.01); *C23C 16/401* (2013.01); *C23C 16/45591* (2013.01)

(58) Field of Classification Search
CPC .............. C23C 16/45591; C23C 16/45565
See application file for complete search history.

(56) References Cited

U.S. PATENT DOCUMENTS

| 2011/0127156 A1* | 6/2011 | Foad ............... G11B 5/8404 204/192.12 |
| 2011/0244128 A1* | 10/2011 | Brcka ............... C23C 16/44 118/724 |
| 2015/0315706 A1* | 11/2015 | Chandrasekharan ........ H01J 37/3244 239/548 |

FOREIGN PATENT DOCUMENTS

| EP | 1031641 A2 * | 8/2000 | ......... C23C 16/4405 |
| KR | 20090003703 U * | 4/2009 | |

* cited by examiner

*Primary Examiner* — Nathan H Empie
(74) *Attorney, Agent, or Firm* — Lippes Mathias LLP (57) ABSTRACT

Methods and systems for chemical vapor deposition (CVD) are disclosed. The methods and systems use a showerhead including a domed internal baffle plate. The domed internal baffle plate is perforated. The presence of the domed internal baffle plate improves the uniformity of gas distribution through the holes of the showerhead across the surface area of the showerhead. This improves deposition uniformity on the semiconducting wafer substrate upon which CVD is being performed, or improves the cleaning of the reaction chamber when a cleaning gas is pumped in through the showerhead.

20 Claims, 8 Drawing Sheets

DEVICE AND METHODS FOR CHEMICAL VAPOR DEPOSITION

BACKGROUND

Chemical vapor deposition (CVD) is a process often used in the semiconductor industry to deposit materials and produce thin films. In a typical CVD process, a substrate (e.g., wafer) is exposed to at least one volatile precursor within a reaction chamber. The precursor reacts and/or decomposes on the substrate surface to produce the desired deposited layer or film. Chemical byproducts and unreacted gases (i.e. exhaust gases) are then removed from the chamber by gas flow using, for example, an exhaust pump.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Similarly, the terms "inlet" and "outlet" are relative to a fluid flowing through them with respect to a given structure, e.g. a fluid flows through the inlet into the structure and flows through the outlet out of the structure. The terms "upstream" and "downstream" are also relative to the direction in which a fluid flows through various components, i.e. the flow fluids through an upstream component prior to flowing through the downstream component.

The term "fluidly connected" is used in the specification to indicate that two components are connected to each other in such a way that a fluid in one component would eventually reach the second component. This term permits other structures and components to be present between the two fluidly connected components.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure may refer to temperatures for certain method steps. It is noted that these references are usually to a temperature measured in the given environment, or set as the desired goal in the given environment, and do not require that temperature to be attained by any particular material within the given environment.

Chemical vapor deposition (CVD) is commonly used in integrated circuit fabrication processes. The CVD may be plasma-enhanced CVD (PECVD). In many PECVD devices, a semiconducting wafer substrate is inserted into a deposition/reaction chamber. One or more gaseous precursors is injected into the deposition/reaction chamber through an assembly that includes a showerhead, and is typically located above the wafer substrate. The precursor is exposed to a plasma generator, such as an electrode pair or a source of microwave radiation, thus converting the precursor into a charged plasma within a plasma zone of the CVD chamber. The exposure of the substrate to the plasma results in chemical reaction and deposition on the substrate, for example to form a thin film which is used as a component of a semiconductor device. However, uneven distribution of the gaseous precursor(s) can result in uneven deposition onto the substrate surface. This results in inconsistent deposition, thereby reducing deposited thickness consistency and process control.

The present disclosure thus relates to devices and methods that address the non-uniform distribution of plasma within the plasma zone by altering the gas flow distribution within the CVD reaction chamber. Generally, process gases and/or cleaning gases are introduced to the CVD reaction chamber through a showerhead. The showerhead contains an internal, perforated baffle plate at the mouth of the gas inlet. The inclusion of this baffle plate within the showerhead changes the distribution of the gaseous precursors within the CVD reaction chamber, resulting in greater uniformity in the thickness of a film deposited on a substrate during the coating methods described herein, and/or a more uniform cleaning gas flow distribution in the cleaning methods described herein.

Figure 1:
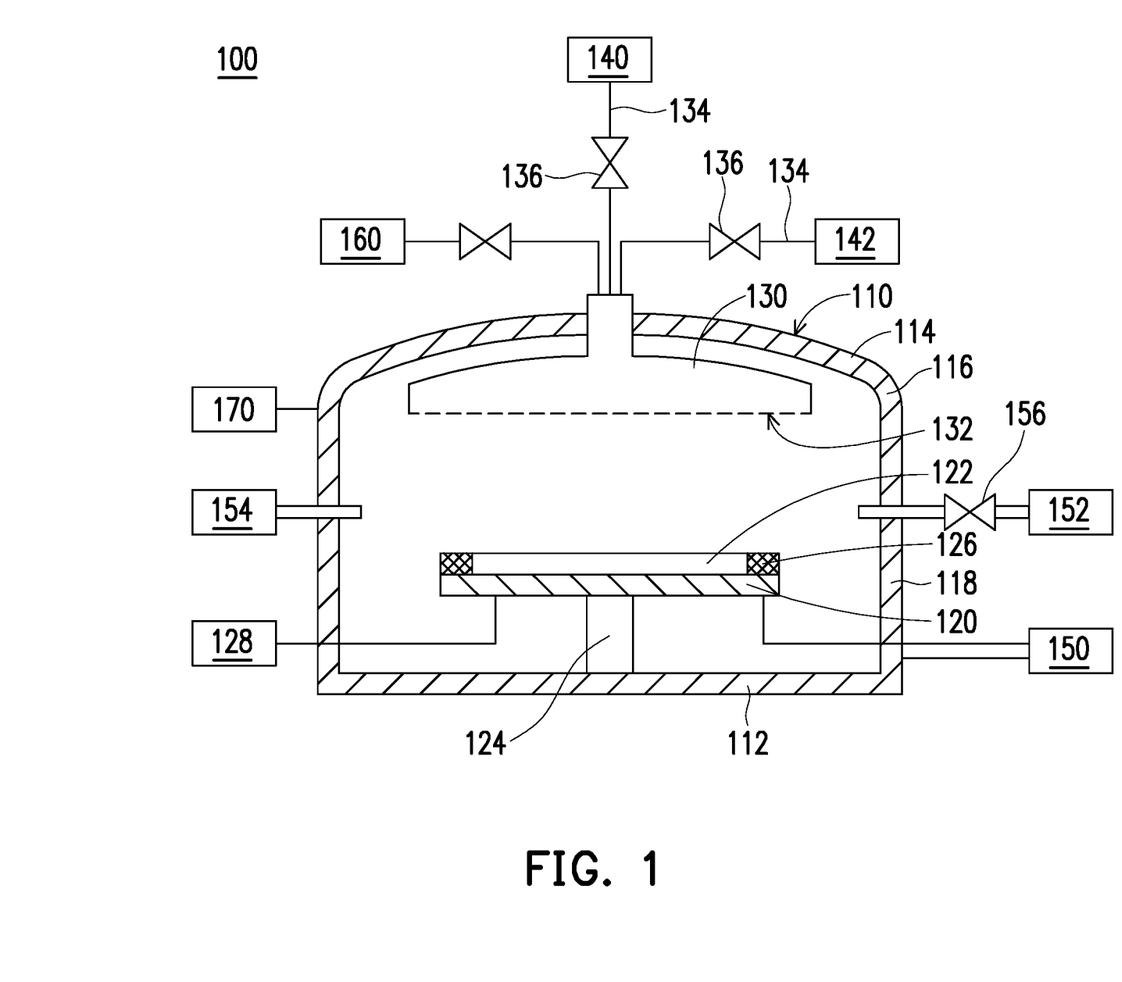
FIG. 1 is a schematic view of a CVD system, in accordance with some embodiments of the disclosure.

FIG. 1 is a schematic view of a CVD system including such a showerhead, in accordance with some embodiments of the disclosure. The deposition system 100 includes a reaction chamber 110 for depositing a film onto a substrate 122. For instance, the deposition system 100 may perform chemical vapor deposition (CVD) processes, for example, plasma enhanced CVD (PECVD) processes or high-density plasma CVD (HDP-CVD) processes, or atomic layer deposition (ALD) processes to deposit one or more layers. In particular embodiments, PECVD is used for the deposition. As illustrated here, the reaction chamber 110 has a chamber bottom wall 112, a chamber top wall 114 shown here in the shape of a dome, and a chamber sidewall 116 connecting the chamber bottom wall 112 to the chamber top wall 114. One or more openings 118 may be present in the chamber sidewall 116. The opening 118 permits a substrate, such as a wafer 122, to enter and exit the reaction chamber 110.

As illustrated in FIG. 1, the reaction chamber 110 may be a cold wall reactor, when the chamber walls 116 of the reaction chamber 110 are kept at a relatively cold temperature. As a result, less deposition usually occurs on the walls, thereby eliminating the risk of particles breaking loose from the chamber walls 116. The internal volume of the reaction chamber may be heated to maintain the reaction gases (silicon precursor gas and ozone) in a gaseous state. This may be done, for example, by using various radiant or convective heat sources. These heat sources may be located within the reaction chamber or its walls, or may be located external to the reaction chamber.

The deposition system 100 includes a pedestal 120 disposed in the reaction chamber 110 for holding the wafer 122 thereon. The pedestal 120 is disposed above the chamber bottom 112. The wafer 122 includes a semiconductor substrate, in which the semiconductor substrate is made of, for example, silicon; a compound semiconductor, such as silicon carbide, indium arsenide, or indium phosphide; or an alloy semiconductor, such as silicon germanium carbide, gallium arsenic phosphide, or gallium indium phosphide. The wafer 122 may also include various doped regions, dielectric features, or multilevel interconnects in the semiconductor substrate. The film (e.g., of a dielectric material) is deposited on the surface of the wafer 122.

In some embodiments, the pedestal 120 comprises a ceramic material. The pedestal 120 may be coupled by a shaft 124 to a lift mechanism (not shown). The shaft 124 may also move up and down. For example, the shaft can lower the pedestal 120 to a transfer position to allow the wafer 122 entering the reaction chamber 110 to be placed on the pedestal 120. The shaft 124 may raise the pedestal 120 to a predetermined processing position. A deposition ring 126 may circumscribe and shield the pedestal 120 from unwanted deposition. The shaft 124 is coupled to a rotary mechanism (not shown). The pedestal 120 can be rotated by the shaft 124, such that the film can be deposited more uniformly on the wafer 122. The pedestal 120 and the reaction chamber 110 are further connected to a heater 150, such that the reaction chamber 110, the pedestal 120 and the wafer 122 thereon can be heated to a predetermined temperature during the deposition process.

The wafer 122 can be held on the pedestal 120 by using an electrostatic charge, a mechanical clamp, a vacuum clamp, or gravity. The wafer 122 on the pedestal 120 can be heated by applying optical techniques (tungsten filament lamps, lasers), thermal radiation techniques, or by using susceptors and radio frequency (RF) induction heating.

The deposition system 100 includes a gas dispenser. The gas dispenser includes a showerhead 130 for introducing reactant gas(es) into the reaction chamber 110. The showerhead 130 is located within the reaction chamber, with some parts that pass through the chamber top wall 114. The showerhead 130 is disposed opposite to the pedestal 120, i.e. above the wafer 122. The showerhead 130 is connected to a reactant gas supply 140, and the reactant gas(es) are fed and dispensed into the reaction chamber 110 via the showerhead 130. The showerhead 130 may be made of aluminum or an aluminum alloy or other suitable metals or materials.

The showerhead 130 includes a plurality of holes 132 for allowing the reactant gas(es) to pass through. In one example of a CVD process, the reactant gases include silane ($SiH_4$) and oxygen ($O_2$), and a silicon oxide layer can be deposited on the surface of the wafer 122 or used to fill the trenches on the wafer 122. For example, the ratio of the $SiH_4$ to $O_2$ can be varied for forming dielectric layers with different properties, such as different index of reflectance. Alternatively, suitable dopants can be introduced into the reaction chamber 110. The deposition reactant gases can use other suitable gases for other corresponding deposition processes. The showerhead 130 may also be connected to a carrier gas supply 142, such as hydrogen, nitrogen, or argon.

The showerhead 130 is connected to the reactant gas supply 140 and the carrier gas supply 142 via a plurality of tubes 134. The gas inlets of the tubes 134 are respectively connected to the corresponding gas outlet of the reactant gas supply 140 or the carrier gas supply 142, and the gas outlets of the tubes 134 are led to the gas inlet of the showerhead 130. In some embodiments, the gas outlets of the tubes 134 can be led to the showerhead 130 individually. Namely, the gases, including the reactant gases and the carrier gas, are led to the showerhead 130 via independent tubes 134, and the reactant gases and the carrier gas are mixed within the showerhead 130. Alternatively, in some embodiments, the inlets of the tubes 134 are connected to the corresponding gas supplies 140 and 142, and the tubes 134 share one gas outlet. Namely, the tubes 134 are connected to the showerhead 130 via the common gas outlet, and the gases, including the reactant gases and the carrier gas, are mixed before entering the showerhead 130. The showerhead includes a domed and perforated internal baffle plate as described herein and illustrated in the other figures.

The deposition system 100 further includes a plurality of valves 136 to control the amount and the ratio of the reactant gases and the carrier gas for being reacted in the reaction chamber 110. The valves 136 can be remote controlled by a controller (not shown).

The reactant gases at room temperature are stored in the reactant gas supply 140. After pressure regulation, the reactant gas flows are measured with, for instance, mass flow meters. However, some reactants are liquids or solids at room temperature and have to be fed to the reaction chamber 110 in other ways. They can be admitted to the reaction chamber 110 by simply heating them above the boiling or sublimation point. The evaporation rate can be varied by varying the supply temperature and/or the dimensions of the capillary from the supplies. Another way of introducing these substances is to use an evaporator or sublimator and a carrier gas. When the evaporator is used, the carrier gas is bubbled through the liquid to be evaporated or flowed above its surface. The carrier gas picks up the liquid substance and transports it into the reaction chamber 110. The evaporation rate depends on the temperature of the liquid, the liquid level in the container, and the flow rate of the carrier gas. If two or more reactant liquids have to be used in the process, it is seldom possible to vaporize them in the same evaporator while maintaining the predetermined molar ratio since they normally have different vapor pressures.

One or more reactant gases are supplied to the interior of reaction chamber 110 from reactant gas supply 140 through the showerhead 130. The reactant gases flow through small holes 132 of the showerhead 130 and over the surface of the wafer 122. The RF power is supplied by a RF power supply 128, and is conducted to the pedestal 120 via coils, while grounding the showerhead 130, or the RF power is conducted to the showerhead 130, while grounding the pedestal 120. In some embodiments, the RF setting may range from about 500 watts to about 2000 watts of radio frequency (RF) power at frequencies ranging from about 50 kilohertz (kHz) to about 100 megahertz (MHz), and in some particular embodiments about 13.56 MHz. This produces an electromagnetic field between the showerhead 130 and the pedestal 120. The electromagnetic field forms a plasma from the reactant gases flowing through holes 132, resulting in CVD of a thin film. Other possible conditions in the reaction chamber include about 5 millitorr (mTorr) to about 100 mTorr of pressure, and/or from about 50° C. to about 150° C. in temperature (as measured at the top wall or the sidewall).

The deposition system 100 includes an exhaust system to exhaust the gas in the reactant chamber 110. In some embodiments, the exhaust system includes a purge gas supply 152 connected to a vent inlet of the reaction chamber 110, and a purge gas evacuation device 154 connected to a vent outlet of the reaction chamber 110. The purge gas supply 152 provides a purge gas to the reaction chamber 110, and the purge gas evacuation device 154 is used to evacuate the purge gas from the reaction chamber 110. The purge gas supply 152 includes a purge conduit which is provided in gas communication with the vent inlet of the reaction chamber 110. A purge valve 156 (which may be manual or electric) is provided in the purge conduit for selectively allowing flow of the purge gas, such as clean dry air, atmospheric air, or nitrogen or other purge gas through the purge conduit and into the reaction chamber 110. The purge gas evacuation device 154 evacuates the reaction chamber 110, replacing any gas within the reaction chamber 110 with the purge gas. The purge gas evacuation device 154 includes an evacuation conduit connected to the vent outlet of the reaction chamber 110, and a vacuum pump. The purge gas collectively directs the processing gas to flow towards the vacuum pump. In some embodiments, the evacuation can be continued by the purge gas evacuation device 154 during wafer loading/unloading processes for preventing the backflow of any contaminants. In some embodiments, such as at reduced pressures, however, the vacuum pump as well as some kind of total pressure control are used so that a constant pressure is maintained within reaction chamber 110.

Periodically, an in situ cleaning cycle is used to remove any contaminants within the reaction chamber 110. The in situ cleaning cycle can be used when it is deemed necessary after inspection or may be performed at regular intervals. Briefly, after removal of wafers, the reaction chamber 110 is closed off. The interior of the reaction chamber 110 is then filled with a gas and a plasma formed, after which oxygen is added and the reaction chamber 110 allowed to bake to an increased temperature for a period of time. Contaminants, such as residual polymers fixed to the inside of the reaction chamber, are decomposed by the plasma. The power is then turned off and the reaction chamber 110 evacuated. The decomposed polymer pieces are discharged out of the reaction chamber by the exhaust system, thereby completing the cleaning process. Subsequently, a cleaning gas with greater cleaning efficiency due to the increased temperature caused by the bake step may be employed.

In some embodiments, the reaction chamber 110 is preheated or baked for a period of time before introducing the cleaning gas. The effect of pre-heating the reaction chamber 110 is to increase the efficiency of the cleaning process, so that lower quantities of cleaning gas are needed. Then, one or more cleaning gas(es) provided by a cleaning gas supply 160 are injected into the reaction chamber 110. The cleaning gas may include at least one gas selected from a group consisting of C, H, F, N, Cl, B, Br, and the combinations thereof. In some embodiments, the cleaning gas can be trifluoromethane ($CHF_3$), tetrafluoromethane ($CF_4$), boron trichloride ($BCl_3$), chlorine ($Cl_2$), ammonia ($NH_3$), bromine ($Br_2$), nitrogen trifluoride ($NF_3$) or the like.

The cleaning gas provided by the cleaning gas supply 160 can be injected into the reaction chamber 110 through the showerhead 130 using the same conduits as the reactant gas, or by conduits different from the reactant gas. The cleaning gas is then converted into a plasma state. For example, possible conditions may include about 500 watts to about 1800 watts of RF power, about 10 watts to about 170 watts of power bias, 2 to 5 Torr of pressure, and/or from about 300° C. to about 500° C. in temperature in the reaction chamber. The cleaning gas may be provided, for example, at a flow rate of about 5 standard cubic centimeters per minute (sccm) to about 60 sccm. The carrier gas utilized in the cleaning process can be Ar or $N_2$, which may be provided at a flow rate of about 20 sccm to about 60 sccm. The total cleaning time for the plasma cleaning process may be from about 2 seconds to about 30 seconds.

The system may further include at least one electromagnet positioned within a periphery of a plasma zone within the reaction chamber and an electromagnet controller configured to provide power to the at least one electromagnet.

A controller 170 may be used to control the various gas flows, pressures, and temperatures to optimize the deposition process upon the semiconductor wafer substrate. The controller may be implemented on one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. Such devices typically include at least memory for storing a control program (e.g. RAM, ROM, EPROM) and a processor for implementing the control program.

The various components of the reaction chamber and the CVD system can be made as desired from conventional materials, such as plastics and/or metals. The various components and their shapes and sizes can be made using conventional manufacturing techniques.

Figure 2:
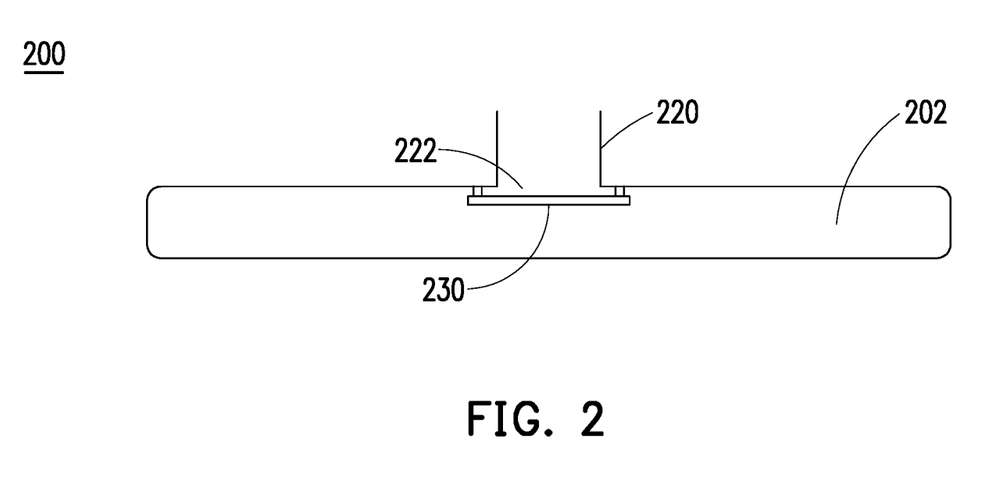
FIG. 2 is a side cross-sectional view of a comparative showerhead used in the CVD system.

Illustrated in FIG. 2 for comparative purposes is a conventional showerhead 200. The showerhead includes a plenum 202 (i.e. hollow space). A gas inlet 220 feeds into the plenum from the top center of the showerhead. A circular, unperforated baffle plate 230 is located at a mouth 222 of the gas inlet, where the gas inlet enters the plenum. Because the baffle plate is unperforated, gas flowing downwards into the showerhead 200 is forced to change direction by 90 degrees, flowing sideways to the outer circumference of the showerhead. Thus, when using the baffle plate of FIG. 2, the entering reactant gas(es) are directed and flow preferentially towards the outer circumference/perimeter of the showerhead and away from the center of the showerhead. This may result in the coating thickness on the edges of the substrate being greater (i.e. thicker) and the coating thickness in the center of the substrate being reduced (i.e. thinner). Such a result is non-optimal in CVD processes, where thickness uniformity of the deposited coating/film across the entire substrate is the desired goal.

Figure 3:
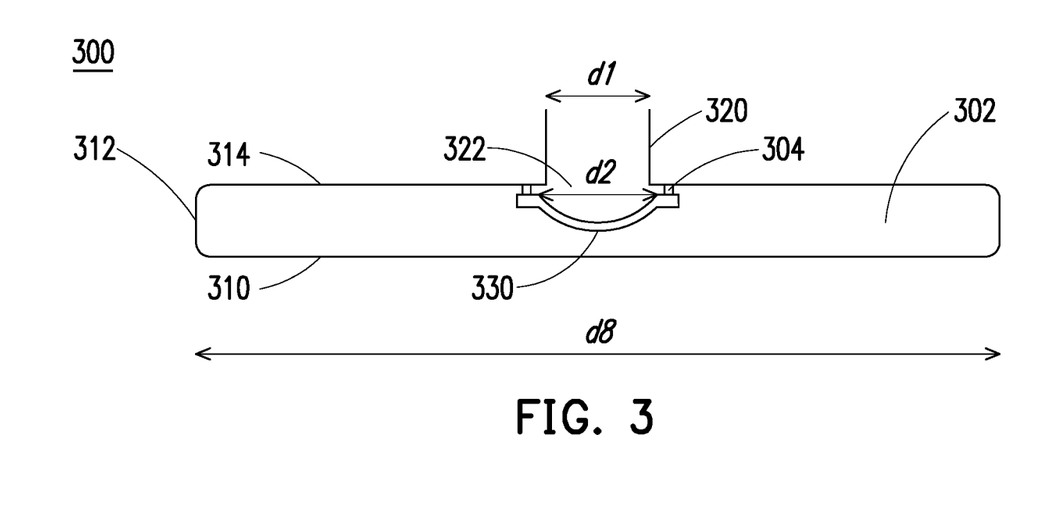
FIG. 3 is a side cross-sectional view of a showerhead, in accordance with other embodiments of the present disclosure.
Figures 4, 6:
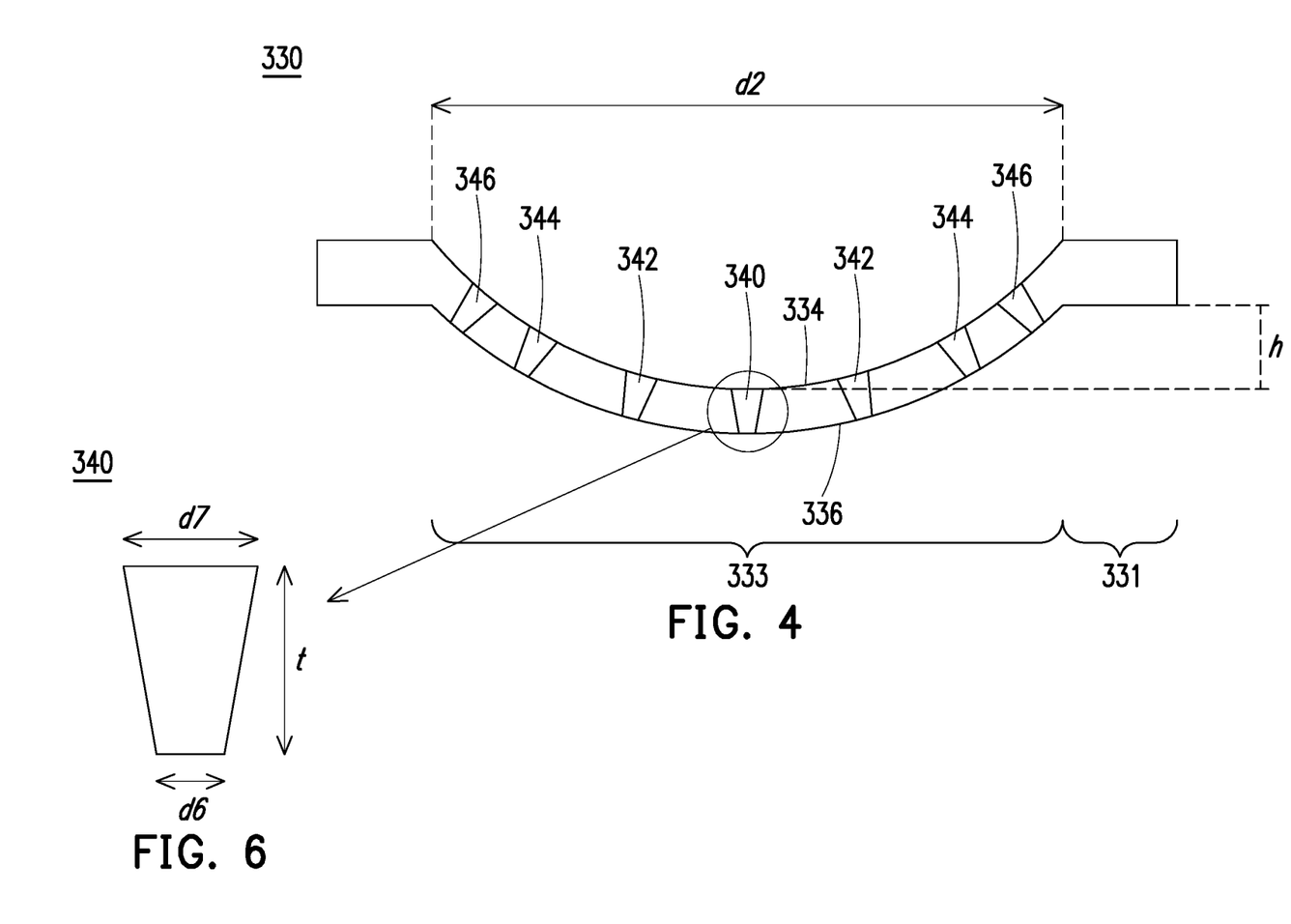
FIG. 4 is a side cross-sectional view of the domed internal baffle plate within the showerhead of FIG. 3, in accordance with some embodiments of the present disclosure.
FIG. 6 is a magnified cross-sectional view of a hole within the domed internal baffle plate.
Figure 5:
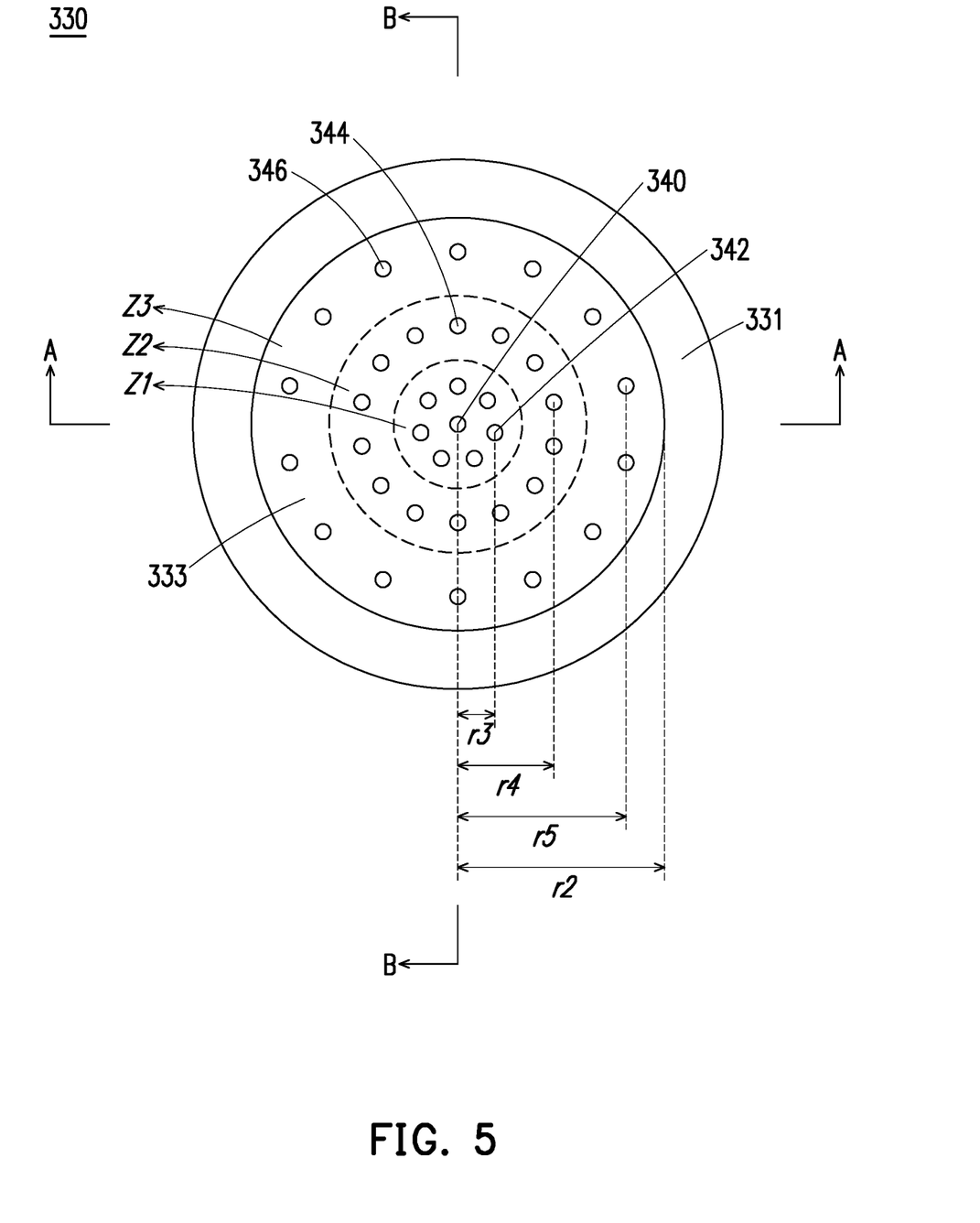
FIG. 5 is a bottom view of the domed internal baffle plate.

FIGS. 3-6 provide different views of the showerhead 300 of the present disclosure, in accordance with some embodiments. FIG. 3 is a side cross-sectional view of the showerhead. FIG. 4 is a side cross-sectional view of the domed internal baffle plate within the showerhead. FIG. 5 is a bottom view of the domed internal baffle plate. FIG. 6 is a magnified cross-sectional view of a hole within the domed internal baffle plate.

Referring first to FIG. 3, the showerhead 300 is formed from the combination of a lower shower plate 310, an outer sidewall 312, and an upper plate 314 which together define a plenum 302 within the showerhead. A gas inlet 320 feeds into the plenum from the top center of the showerhead. The mouth 322 of the gas inlet is located where the gas inlet meets the upper plate 314. It is noted that although described as separate components, these components of the showerhead can be made as one integral piece, or in multiple pieces which are then assembled to form the showerhead.

A plurality of support posts 304 are present around the mouth 322 of the gas inlet. A domed internal baffle plate 330 is located within the showerhead 300 (hence internal baffle plate). The domed internal baffle plate 330 is fastened to these posts. This may be done, for example, by adhesive, welding, screwing a fastener through the baffle plate and into the post, or other means known in the art. It is noted that the posts do not form a wall around the mouth such that all gas must pass through the baffle plate 330. Rather, incoming gas can still flow sideways past the posts and out towards the outer circumference of the showerhead. The baffle plate 330 is thus located at the mouth 322 of the gas inlet, where the gas inlet enters the plenum.

FIG. 4 and FIG. 5 show the baffle plate 330 in isolation (i.e., removed from the showerhead). The baffle plate 330 may contain or be composed of aluminum or an aluminum alloy, or of other suitable metal or material. The baffle plate may be considered to have two separate parts, a lip 331 and a domed portion 333. The cross-sectional view shown in FIG. 4 is the same along both lines A-A and B-B of FIG. 5. In other words, the domed portion 333 is spherical, not cylindrical or some other shape. Referring back to FIG. 3, the baffle plate is attached to the support posts 304 along the lip 331.

Referring again to FIG. 4 and FIG. 5 together, the domed portion 333 includes an internal surface 334 and an external surface 336. A plurality of holes or perforations extends through the domed portion 333 of the baffle plate, from the internal surface through to the external surface of the domed portion. The holes/perforations include a central hole 340, a first array 342 of holes, a second array 344 of holes, and a third array 346 of holes. The central hole 340 is located at the center of the domed portion 333. The first array 342 of holes is distributed circumferentially around the central hole 340. The second array 344 of holes is distributed circumferentially around the first array 342 of holes. The third array 346 of holes is distributed circumferentially around the second array 344 of holes. It is contemplated that in particular embodiments, the first array of holes are all located the same distance from the center of the domed portion; the second array of holes are all located the same distance from the center of the domed portion; and the third array of holes are all located the same distance from the center of the domed portion. It is noted that incoming gas will flow through these holes in the domed portion 333, whereas holes in the lip 331 (if any) will be used for fastening the baffle plate to the posts.

Referring now to FIG. 3 and FIG. 4 together, three lengths are shown in FIG. 3. Diameter d1 represents the diameter of the gas inlet 320. Diameter d2 represents the diameter of the domed portion 333 of the baffle plate 330 at the mouth of the gas inlet. Diameter d8 is the diameter of the lower shower plate 310, where gas exits the showerhead itself. Two lengths are illustrated in FIG. 4. Diameter d2 is the diameter of the domed portion 333 of the baffle plate 330. Height h is the height of the domed portion 333, which is greatest at the center of the baffle plate. This height h is measured between the lower surface of the lip 335 and the internal surface of the domed portion 333.

The diameter d8 of the showerhead may vary depending on the wafer size. Wafer sizes (i.e. diameters) may include 100 mm, 150 mm, 200 mm, or 300 mm, and in the future may go up to 450 mm or higher. In some particular embodiments, then, the diameter d8 may range from about 100 mm to about 450 mm, including from about 300 mm to about 350 mm for current wafer sizes.

The diameter d2 of the domed portion is constrained on the upper end by the diameter d8 of the showerhead. In specific embodiments, the ratio of d8 to d2 (d8/d2) is from about 0.0161 to about 0.0183.

The diameter d2 of the domed portion is constrained on the lower end by the diameter d1 of the gas inlet. In specific embodiments, the ratio of d2 to d1 (d2/d1) is from about 1.32 to about 1.85, including from about 1.5 to about 1.7. in other words, the domed portion has a diameter greater than that of the gas inlet.

Referring to FIG. 4, the diameter d2 of the domed portion is greater than the height h of the domed portion. In some particular embodiments, the ratio of d2 to h (d2/h) is from about 2.1 to about 10.8.

Continuing, FIG. 5 is a plan view of the external surface of the baffle plate 330. The dashed lines separate various zones. As illustrated here, there are three zones arranged concentrically (in this plan view, recognizing the surface of the domed portion is actually part of a sphere). The first zone Z1 is at the center of the baffle plate. Located within the first zone are the central hole 340 and the first array 342 of holes. The second zone Z2 contains the second array 344 of holes. The third zone Z3 contains the third array 346 of holes. The second zone Z2 and the third zone Z3 can be described as annular, if desired. The holes are circular for ease of production, although they may have other shapes if desired.

The distance r2 represents the distance from the center of the domed portion 333 (which is also the center of central hole 340) to the lip 331. This is also the radius of the domed portion, or in other words r2 equals one-half of diameter d2. Radius r3 represents the distance between a center of the central hole 340 and a center of any one of the holes of the first array 342. Radius r4 represents the distance between a circle extending through the holes of the first array 342 and a circle extending through the holes of the second array 344. Radius r5 represents the distance between a circle extending through the holes of the second array 344 and a circle extending through the holes of the third array 346.

In particular embodiments, radius r3 is from about ⅙ to about ⅕ of the radius r2. Put another way, the first array of holes is located at a diameter that is from about ⅙ to about ⅕ of the diameter d2.

In particular embodiments, radius r4 is from about ¼ to about ½ of the radius r2. Put another way, the second array of holes is located at a diameter that is from about ¼ to about ½ of the diameter d2.

In particular embodiments, radius r5 is from about ½ to about ¾ of the radius r2. Put another way, the third array of holes is located at a diameter that is from about ½ to about ¾ of the diameter d2.

The dotted lines defining the three zones Z1, Z2, Z3 in FIG. 5 are located between these radii r3, r4, r5. In particular embodiments, the radius r3 is less than radius r4, and radius r4 is less than or equal to the radius r5.

As illustrated in FIG. 5, the first zone Z1 includes 8 total holes (1 central hole plus 7 holes in the first array). However, it should be understood that Z1 could include more or less than 8 holes in other embodiments. The second zone Z2 is depicted with 14 total holes, but could include more or fewer holes in other embodiments. The third zone Z3 is depicted with 14 total holes, but could include more or fewer holes in other embodiments. In particular embodiments, the two zones Z2 and Z3 may contain the same number of holes or a different number of holes. In some embodiments, the two zones Z2 and Z3 each contains more holes than the first zone Z1.

The total hole area in each zone is determined by summing the area of each hole in the given zone. In particular embodiments, the total hole area in the third zone Z3 is less than the sum of the total hole area of the first zone Z1 and the total hole area of the second zone Z2 (i.e. Z3<Z1+Z2). Referring back to FIG. 3, it should be kept in mind that process gas still flows sideways around the posts and towards the outer perimeter of the showerhead, and that not all process gas must pass through the domed internal baffle plate.

The total hole area of the domed portion 333 of the domed internal baffle plate is determined by summing the area of all holes together. The domed portion also has a total surface area. In particular embodiments, the ratio of the total hole area of the domed portion to the total surface area of the domed portion (i.e. HA/SA) is from about 0.06 to about 0.48. In other words, the total hole area of the domed portion of the baffle plate is from about 6% to about 48% of the total surface area of the domed portion.

Although FIG. 5 illustrates three zones and three circumferentially oriented arrays of holes around the central hole, generally, any number of zones and arrays may be used. One array of holes is located within each zone. For example, the number of zones and arrays may be 2, 3, 4, 5, 6, 7, 8, 9, or 10. When the number of zones and arrays is greater, the holes may be smaller (i.e. have a smaller diameter).

In FIG. 5, the lip 331 is illustrated as having a constant width around the domed portion 333, or in other words has an annular shape. It is noted that the lip can have any desired shape. For example, the lip may be irregularly shaped to provide directionality to the baffle plate, such as having a rectangular extension in one direction to engage the support posts or fit within the showerhead in a specified manner. This may aid, for example, in fixing the locations of the holes of the baffle plate in particular locations relative to the holes of the showerhead.

Continuing, FIG. 6 is a magnified view of the central hole 340, and is illustrative of the shape of the other holes in the domed internal baffle plate 330. As seen here, the hole tapers from the internal surface of the domed portion to the external surface of the domed portion. The outlet diameter of the hole (along the external surface) is marked with reference numeral d6. The inlet diameter (along the internal surface) is marked with reference numeral d7. As seen here, the inlet diameter d7 is larger or greater than the outlet diameter d6. In particular embodiments, the ratio of d7 to d6 (d7/d6) is from about 1.2 to about 2.6. The outlet diameter d6 may be from about 1.0 mm to about 2.1 mm. In addition, the thickness of at least the domed portion of the domed internal baffle plate is indicated with reference numeral t. In embodiments, the domed portion of the domed internal baffle plate may have a thickness of about 1 millimeter (mm) to about 5 mm. The lip may also have a thickness within this range, but does not have to be the same thickness as the domed portion.

It is generally contemplated that all of the holes in the domed portion of the domed internal baffle plate have the same shape. In other words, they have the same inlet diameter and outlet diameter. However, in other embodiments, all holes in the same zone have the same shape, but the shape may differ between different zones.

Figure 7:
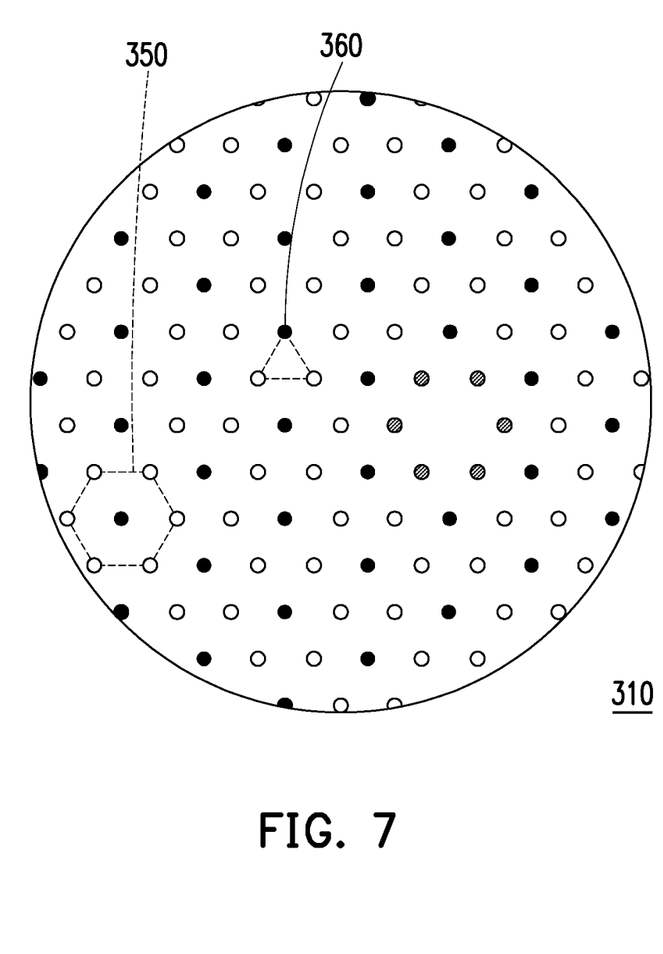
FIG. 7 is a plan view of a portion of the lower shower plate of the showerhead containing the domed internal baffle plate.

Referring now to FIG. 3 and FIG. 7 together, the showerhead itself also has holes through the lower shower plate, through which the process gas(es) enter the reaction chamber for CVD. FIG. 7 is a plan view of a portion of the lower shower plate 310, and is intended to illustrate part of the structure of the showerhead 300. As illustrated here, the holes in the showerhead generally also have a circular shape, though this can also vary if desired. The showerhead may include from about 2,000 holes to about 6,000 holes in total. The holes may be arranged in hexagonal lattices or triangular lattices. Here, the blank holes are arranged in a hexagonal lattice, as indicated with reference number 350. However, if the dark holes are included throughout the surface of the lower shower plate, then the holes are arranged in a triangular lattice, as indicated with reference number 360.

In particular embodiments, the ratio of the total hole area of the domed portion of the domed internal baffle plate (see FIG. 5) to the total hole area of the showerhead may be from about 0.00164 to about 0.0170.

In some embodiments, the CVD process is used to deposit a dielectric layer comprising at least one dielectric material. Non-limiting embodiments of dielectric materials phosphosilicate glass (PSG), fluorosilicate glass (FSG), undoped silicate glass (USG), hard black diamond (HBD), extreme low k (ELK) dielectrics, high-stress undoped silicate glass (HSUSG), or any combination of two or more thereof.

For depositing an HSUSG or USG layer, the process gases provided may include $SiH_4$, $N_2$, $NF_3$, $N_2O$, Ar, and $O_2$. The $SiH_4$, $O_2$, and $N_2O$ are reactant gases used to produce the glass layer. $N_2$ and Ar are used as a carrier gas as well as to increase the pressure of the gas flow. $NF_3$ may aid in cleaning the chamber walls. In some embodiments, the flow ratio of $SiH_4:N_2:N_2O$ may be about 1:5:23. The flow ratio of $NF_3:N_2:Ar$ may be about 6:1:1-6. The total gas flow may equal or be in excess of 5600 sccm. It should be recognized that the cleaning gas may be introduced during the CVD process itself or during a separate cleaning step.

As another example, sub-atmospheric pressure chemical vapor deposition (SACVD) can be used to form silicon oxide ($SiO_x$) insulating layers. A silicon-containing source gas acts as a silicon precursor, providing silicon for the reaction. Examples of such silicon precursors include but are not limited to tetraethyl orthosilicate (TEOS), trimethylsilane, tetramethylsilane, and hexachlorodisilane (HCDS).

Ozone ($O_3$) is used to provide oxygen atoms for the reaction. At temperatures of about 300° C. to about 500° C. or higher, these gases will react to deposit silicon oxide.

Other types of layers can also be formed using CVD. As yet another example, a polysilicon layer may be formed by decomposing $SiH_4$ at temperatures of about 500° C. to about 800° C. A tungsten silicide (WSix) layer can be formed, typically using dichlorosilane ($SiH_2Cl_2$) and tungsten hexafluoride ($WF_6$) as the process gases. The reaction occurs at temperatures of about 500° C. to about 600° C.

Figure 8:
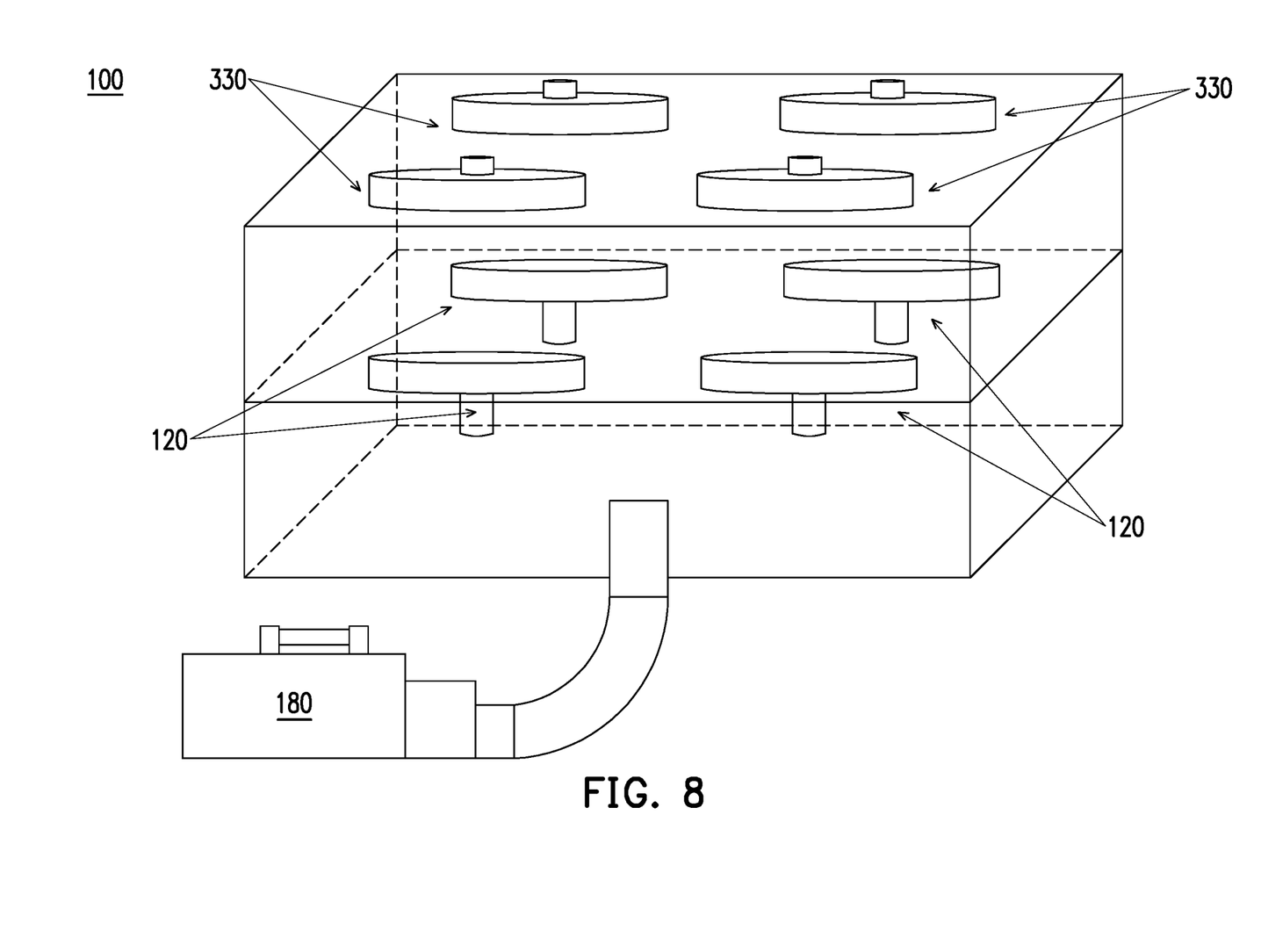
FIG. 8 is an illustration of a CVD system containing multiple showerheads, one for each pedestal, for simultaneous coating of multiple substrates.

FIG. 1 depicts a deposition system 100 with a single showerhead 130 and a single pedestal 120 for simplicity. However, it should be recognized that the systems, devices, and processes of the present disclosure may include multiple showerheads and/or multiple pedestals for coating multiple substrates simultaneously. FIG. 8 illustrates an example of such a system 100, which includes four showerheads 330 and four pedestals 120. An exhaust pump 180 is also illustrated for removing gases from the reaction chamber 110. Such devices are commercially available, for example including the Vector Express or Vector Extreme PECVD tools offered by Novellus Systems (now part of Lam Research Corporation).

Figure 9:
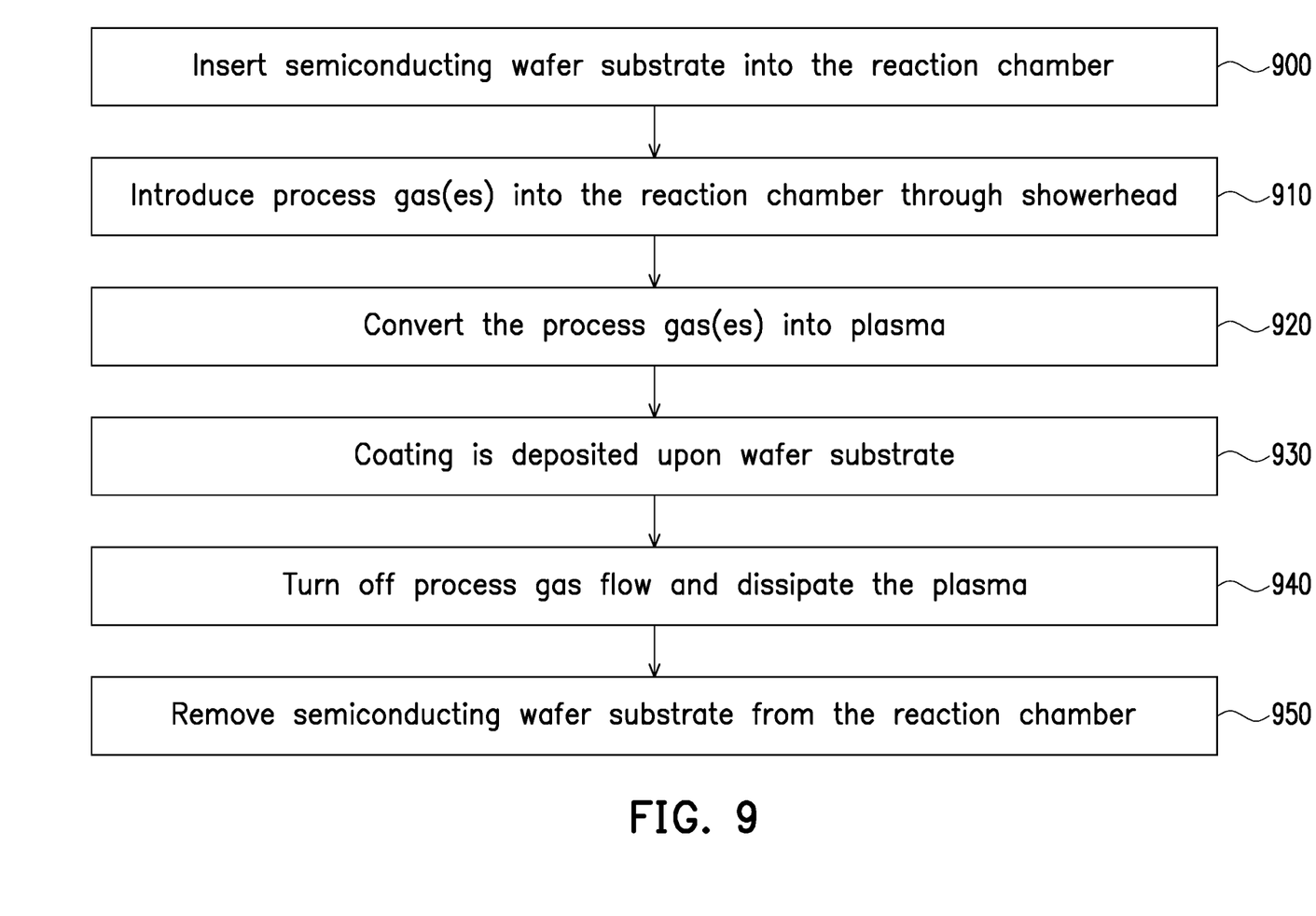
FIG. 9 is a flowchart illustrating a method for performing chemical vapor deposition (CVD).

FIG. 9 is a flowchart illustrating a method for performing chemical vapor deposition (CVD). In step 900, a wafer substrate is inserted into the reaction chamber of a CVD system. The wafer substrate may be placed on a pedestal within the reaction chamber and fixed in place. In step 910, one or more process gases is introduced into the reaction chamber through a showerhead above the substrate. The showerhead contains the domed internal baffle plate of FIGS. 3-6. In step 920, the process gas(es) are converted into plasma through the application of energy. In step 930, a coating is deposited upon the wafer substrate. In step 940, the inflow of process gases is turned off, and the plasma is dissipated. In step 950, the wafer substrate, now with a thin film or coating, is removed from the reaction chamber.

Figure 10:
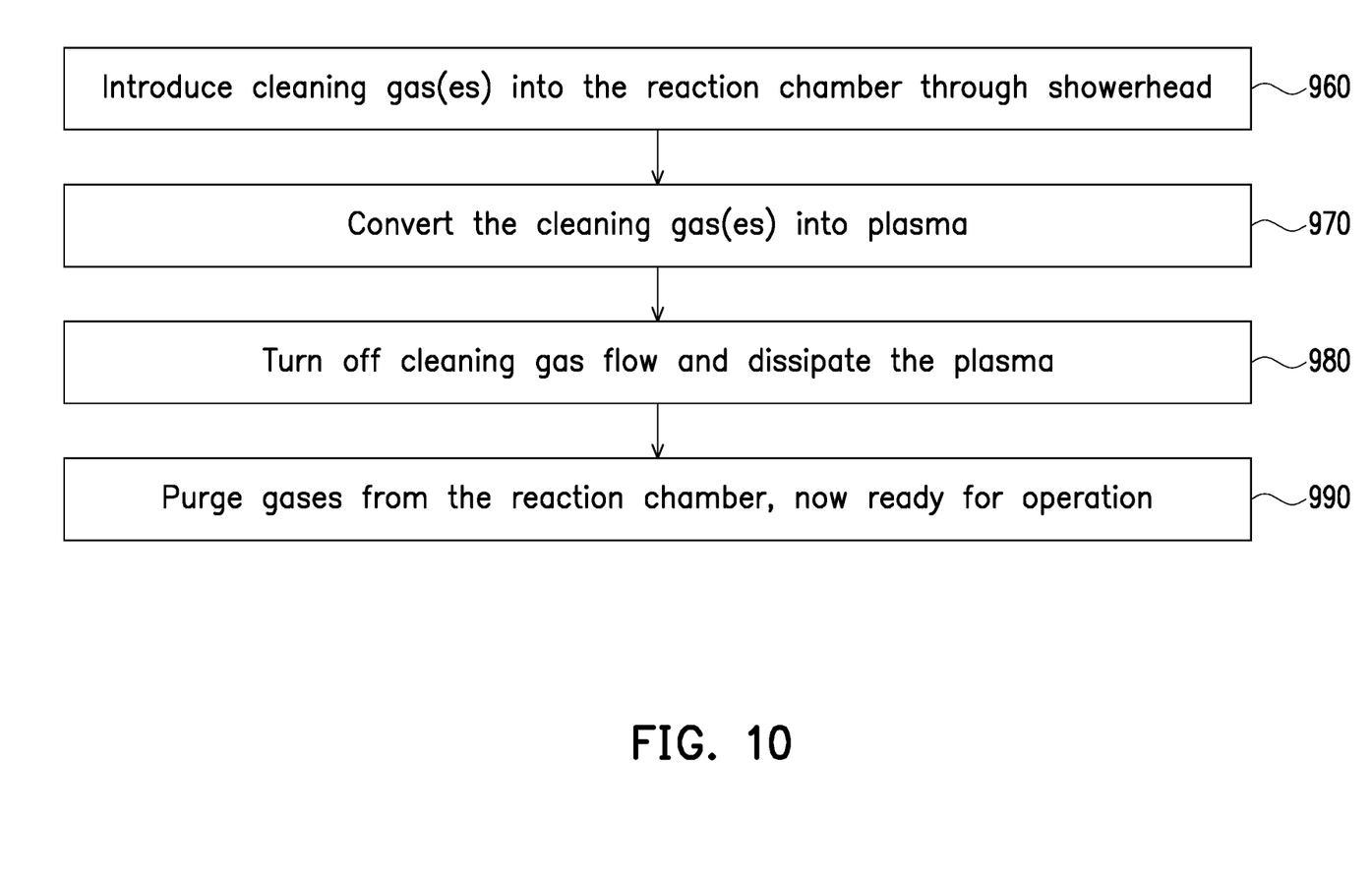
FIG. 10 is a flowchart illustrating a method for cleaning a reaction chamber of a CVD system.

FIG. 10 is a flowchart illustrating a method for cleaning a reaction chamber of a CVD system. Generally, the reaction chamber should be empty. In step 960, one or more cleaning gases is introduced into the reaction chamber through a showerhead above the substrate. Again, the showerhead contains the domed internal baffle plate of FIGS. 3-6. In step 970, the cleaning gas(es) are converted into plasma through the application of energy. The plasma is then maintained for a set period of time. In step 980, the inflow of cleaning gas is turned off, and the plasma is dissipated. In step 990, the gases in the reaction chamber are purged. The reaction chamber is thus cleaned and ready for operation.

To summarize, the showerhead 330 of the present disclosure includes a domed internal baffle plate 330 that is domed and perforated, rather than flat and unperforated. This results in a more uniform distribution of gas throughout the showerhead. In particular, the process gas may now flow more easily towards the center of the showerhead. This improves the film deposition uniformity onto the wafer substrate located below the showerhead. In some experiments, the wafer uniformity improved from 0.8% to 0.4%, with a lower value being more desirable. This can also be considered a 50% improvement in the wafer uniformity.

Some embodiments of the present disclosure thus relate to a chemical vapor deposition (CVD) method. At least one process gas is introduced into a reaction chamber through a showerhead located above a substrate to be coated. The showerhead comprises a gas inlet feeding into a plenum and a domed internal baffle plate at a mouth of the gas inlet. The domed internal baffle plate comprises a plurality of perforations.

Other embodiments of the present disclosure relate to a chemical vapor deposition device. The CVD device comprises a reaction chamber; a pedestal within the reaction chamber for supporting a wafer substrate; and a showerhead within the reaction chamber located above the pedestal. The showerhead comprises a gas inlet feeding into a plenum and a domed internal baffle plate at a mouth of the gas inlet. The domed internal baffle plate comprises a plurality of perforations.

Also disclosed in various embodiments are showerheads for use in a CVD system. The showerhead comprises a lower shower plate with a plurality of holes; an outer sidewall about a circumference of the lower shower plate; an upper plate with a gas inlet at a center of the upper plate; and a domed internal baffle plate comprising a plurality of perforations. The lower shower plate, the outer sidewall, and the upper plate together define a plenum. The domed internal baffle plate is located within the plenum at the gas inlet.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical vapor deposition (CVD) method comprising:
    introducing at least one process gas into a reaction chamber through a showerhead located above a substrate to be coated;
    wherein the showerhead comprises:
    a gas inlet feeding into a plenum comprising an upper plate, an outer sidewall, and a lower shower plate having holes therein;
    a domed internal baffle plate located within the plenum at a mouth of the gas inlet, the domed internal baffle plate comprising a lip and a domed portion; the domed internal baffle plate comprises a plurality of perforations;
    wherein the perforations consist of:
    a first zone of perforations consisting of a central hole and a first plurality of holes distributed in a first circle around the central hole having a diameter that is about ⅙ to about ⅕ of a diameter of the domed portion of the domed internal baffle plate;
    a second zone of perforations consisting of a second plurality of holes distributed in a second circle around the first circle and having a diameter that is about ¼ to about ½ of the diameter of the domed portion of the domed internal baffle plate; and
    a third zone of perforations consisting of a third plurality of holes distributed in a third circle around the second circle and having a diameter that is about ½ to about ¾ of the diameter of the domed portion of the domed internal baffle plate.

2. The method of claim 1, wherein the perforations have an inlet diameter along an internal surface of the domed internal baffle plate and an outlet diameter along an external surface of the domed internal baffle plate; and wherein the inlet diameter is larger than the outlet diameter.

3. The method of claim 2, wherein a ratio of the inlet diameter to the outlet diameter is in a range of about 1.2 to about 2.6.

4. The method of claim 2, wherein the outlet diameter is from about 1.0 mm to about 2.1 mm.

5. The method of claim 1, wherein a ratio of a diameter of a domed portion of the domed internal baffle plate to a height of the domed internal baffle plate is from about 2.1 to about 10.8.

6. The method of claim 1, wherein a ratio of a diameter of a domed portion of the domed internal baffle plate to a diameter of the gas inlet is from about 1.32 to about 1.85.

7. The method of claim 1, wherein the at least one process gas comprises $SiH_4$, $N_2$, $NF_3$, $N_2O$, Ar, and $O_2$ for depositing a high-stress undoped silicate glass layer or an undoped silicate glass layer.

8. The method of claim 1, wherein a ratio of a total hole area on an external surface of the domed internal baffle plate to a total hole area of the showerhead is from about 0.00164 to about 0.0170.

9. The method of claim 1, wherein a ratio of a total hole area on an external surface of the domed internal baffle plate to a total external surface area of the domed internal baffle plate is from about 0.06 to about 0.48.

10. The method of claim 1, wherein the at least one process gas includes one or more reactant gases and a carrier gas.

11. The method of claim 1, wherein a total hole area of the third zone is less than a sum of a total hole area of the first zone and a total hole area of the second zone.

12. A chemical vapor deposition (CVD) method comprising:
introducing at least one process gas into a reaction chamber through a showerhead located above a substrate to be coated;
wherein the showerhead comprises a gas inlet feeding into a plenum and a domed internal baffle plate at a mouth of the gas inlet, the domed internal baffle plate comprising a plurality of perforations;
wherein the perforations have an inlet diameter along an internal surface of the domed internal baffle plate and an outlet diameter along an external surface of the domed internal baffle plate; and a ratio of the inlet diameter to the outlet diameter is from about 1.2 to about 2.6, and the outlet diameter is from 1.0 mm to 2.1 mm; and
wherein the perforations consist of:
a first zone of perforations consisting of a central hole and a first plurality of holes distributed in a first circle around the central hole having a diameter that is about ⅙ to about ⅓ of a diameter of the domed portion of the domed internal baffle plate;
a second zone of perforations consisting of a second plurality of holes distributed in a second circle around the first zone of perforations, the second circle having a diameter that is about ¼ to about ½ of the diameter of the domed portion of the domed internal baffle plate; and
a third zone of perforations consisting of a third plurality of holes distributed in a third circle around the second zone of perforations, the third circle having a diameter that is about ½ to about ¾ of the diameter of the domed portion of the domed internal baffle plate.

13. The method of claim 12, wherein a ratio of a diameter of a domed portion of the domed internal baffle plate to a height of the domed portion of the domed internal baffle plate is from about 2.1 to about 10.8.

14. The method of claim 12, wherein a ratio of a diameter of a domed portion of the domed internal baffle plate to a diameter of the gas inlet is from about 1.32 to about 1.85.

15. The method of claim 12, wherein a ratio of a total hole area on an external surface of the domed internal baffle plate to a total hole area of the showerhead is from about 0.00164 to about 0.0170; or
wherein a ratio of a total hole area of on an external surface the domed internal baffle plate to a total surface area on an external surface of the domed internal baffle plate is from about 0.06 to about 0.48.

16. The method of claim 12, wherein the showerhead further comprises a lower shower plate having from about 3000 to about 6000 holes; or wherein the device further comprises a radio frequency power supply for generating a plasma within the reaction chamber, or the device further comprises a purge gas evacuation device.

17. A chemical vapor deposition (CVD) method comprising:
introducing at least one process gas into a reaction chamber through a showerhead located above a substrate to be coated;
wherein the showerhead comprises a gas inlet feeding into a plenum and a domed internal baffle plate at a mouth of the gas inlet, the domed internal baffle plate comprising a lip and a domed portion; the domed internal baffle plate comprises a plurality of perforations;
wherein the plenum is defined by a lower shower plate, an outer sidewall, and an upper plate;
wherein the lower shower plate comprises a plurality of holes, the outer sidewall is located about a circumference of the lower shower plate, and the gas inlet is at a center of the upper plate; and
the domed internal baffle plate is located within the plenum at the gas inlet; and
wherein the perforations consist of:
a first zone of perforations consisting of a central hole and a first plurality of holes distributed in a first circle around the central hole;
a second zone of perforations consisting of a second plurality of holes distributed in a second circle around the first circle; and
a third zone of perforations consisting of a third plurality of holes distributed in a third circle around the second circle;
wherein a total hole area of the third zone is less than a sum of a total hole area of the first zone and a total hole area of the second zone.

18. The method of claim 17, wherein the perforations have an inlet diameter along an internal surface of the domed internal baffle plate and an outlet diameter along an external surface of the domed internal baffle plate; and a ratio of the inlet diameter to the outlet diameter is from about 1.2 to about 2.6, and the outlet diameter is from 1.0 mm to 2.1 mm.

19. The method of claim 17, wherein the at least one process gas includes one or more reactant gases and a carrier gas.

20. The method of claim 17, wherein the at least one process gas comprises $SiH_4$, $N_2$, $NF_3$, $N_2O$, Ar, and $O_2$ for depositing a high-stress undoped silicate glass layer or an undoped silicate glass layer.

* * * * *